US006363155B1

(12) United States Patent
Horbach

(10) Patent No.: US 6,363,155 B1
(45) Date of Patent: Mar. 26, 2002

(54) PROCESS AND DEVICE FOR MIXING SOUND SIGNALS

(75) Inventor: Ulrich Horbach, Dänikon (CH)

(73) Assignee: Studer Professional Audio AG, Regensdorf (CH)

(*) Notice: Subject to any disclaimer, the term of this patent is extended or adjusted under 35 U.S.C. 154(b) by 0 days.

(21) Appl. No.: 08/996,203

(22) Filed: Dec. 22, 1997

(30) Foreign Application Priority Data

Sep. 24, 1997 (CH) .............................................. 2248/97

(51) Int. Cl.[7] ............................ H04R 5/00; H03G 3/00
(52) U.S. Cl. ............................ 381/17; 381/18; 381/61
(58) Field of Search ............................ 381/17, 18, 61, 381/63, 1, 19–23

(56) References Cited

U.S. PATENT DOCUMENTS

| | | | | | |
|---|---|---|---|---|---|
| 5,195,140 A | * | 3/1993 | Kudo et al. | .................... | 381/63 |
| 5,337,366 A | * | 8/1994 | Eguchi et al. | ................ | 381/71 |
| 5,420,929 A | * | 5/1995 | Geddes et al. | ................. | 381/1 |
| 5,438,623 A | * | 8/1995 | Begault | ........................ | 381/17 |
| 5,742,689 A | * | 4/1998 | Tucker et al. | ................. | 381/17 |

OTHER PUBLICATIONS

F. Richter and A. Persterer, "Design and Application of a Creative Audio Processor," 86th AES Convention, Hamburg, Germany, Preprint 2782 (U–4) (Mar. 1989).

D. S. Mc Grath and A. Reilly, "A Suite of DSP Tools for Creation, Manipulation and Playback of Soundfields in the Huron Digital Audio Convolution Workstation," 100th AES Convention, Copenhagen, Denmark, Preprint 4233 (N–3) (May 1996).

D. H. Cooper, "Calculator Program for Head–related Transfer Function" *Audio Engineering Society* (*AES*) *Journal*, No. 37, pp. 3–17, (Jan./Feb. 1982).

B. Gardner, K. Martin, "HRTF Measurements of a KEMAR Dummy–Head Microphone," MIT Media Lab Preception Computing–Technical Report #280, Internet @ http://sound.media.mit.edu/Kemar/html, (1994).

* cited by examiner

*Primary Examiner*—Forester W. Isen
*Assistant Examiner*—Laura A. Grier
(74) *Attorney, Agent, or Firm*—Greenblum & Bernstein, P.L.C.

(57) ABSTRACT

The present invention is directed to a process and device for mixing a plurality of sound signals. The process includes separating each sound signal and selectively delaying each separated sound signal. The process also includes selectively weighting each separated and selectively delayed sound signal and adding corresponding ones of the selectively weighted signals to an intermediary signal. The process also includes separating and filtering each intermediary signal, and adding the intermediary signals to form an output signal. The device for mixing sound signals of a plurality of input channels into a plurality of output channels includes each input channel having a plurality of partial channels, a decoder providing the plurality of outputs, and a plurality of intermediary channels coupled to the plurality of partial channels and to the decoder.

7 Claims, 5 Drawing Sheets

PROCESS AND DEVICE FOR MIXING SOUND SIGNALS

CROSS-REFERENCE TO RELATED APPLICATIONS

The present application claims priority under 35 U.S.C. § 119 of Swiss Patent Application No. 2248/97 filed Sep. 24, 1997, the disclosure of which is expressly incorporated by reference herein in its entirety.

BACKGROUND OF THE INVENTION

1. Field of the Invention

The present invention relates to a process and a device for mixing sound signals.

2. Discussion of the Background Information

Devices of the type described above are generally referred to as audio mixing consoles and provide parallel processing of a plurality of sound signals. In the wake of integrating new media (HDTV, home theater, DVD), stereo technology will be replaced by multi-channel, i.e., “surround” playback processes. Surround-sound mixing consoles currently available on the market generally contain a bus matrix that is expanded to several output channels. For example, N input channels (e.g., N=8–265) are generated by mono-microphones and are processed in the individual channels, i.e., 1–N, weighted with factors, and wired to a bus bar. Control of these factors, for achieving acoustic positioning of the sound source within the room, is provided through panorama potentiometers (or “panpots”) such that an. In this context, “phantom sound sources” are created in which the listener experiences the illusion that the sound in the room is created outside the loudspeaker.

Psycho-acoustic research and experience of recent years has shown that the process mentioned above, known as “amplitude panning”, only achieves an insufficient room mapping or playback of a sound field in a room in two dimensions. Thus, the phantom sound sources can only occur on connecting lines between loudspeakers, and they are not very stable. In particular, the location of the phantom sound sources change with the specific position of the listener. However, a much more natural playback is perceived by the listener if, e.g., the following two aspects are considered:

a) Loudspeaker signals are created such that the listener receives the same relative transit time differences and frequency-dependent damping processes in the left and right ear signal, i.e., as when listening to natural sound sources. Ear signals have to be correlated in a similar fashion. At low frequencies, the transit time differences are effective for localizing sound occurrences, while at higher frequencies (e.g., >1000 Hz), amplitude (intensity) differences are for the most part effective. In conventional amplitude panning, all frequencies are substantially equally dampened and transit time differences are not considered. If one substitutes the weight factors with variable filters designed in the appropriate dimensions, both localization mechanisms can be satisfied. This process is generally referred to as a panoramic setting with the aid of filtering (i.e., “pan-filtering” ).

b) If a sound source is located in a room, the first reflections and those arriving up to a maximum of 80 msec after the direct sound aid in localizing the sound source. Distance perception particularly depends on the component of the reflections relative to the direct amount. Such reflections can be simulated in a audio mixing console or synthesized by delaying the signal several times and then assigning the signals created in this manner into different directions through the pan-filters described above.

Thus, the prior art sought to provide an audio mixing console that includes the above-mentioned features a) and b) while ensuring an affordable, i.e., a comparatively more economical, technical expenditure.

One of the first digital constructions was introduced by F. Richter and A. Persterer in “Design and Application of a Creative Audio Processor” at the 86th AES Convention in Hamburg, Germany in 1989 and published in preprint 2782. In this device, direct pairs of “head related transfer functions” (HRTF), i.e., filter functions measured with the right or left ear when a test signal is sent in a certain room direction, are used as pan-filters. An appropriate HRTF-pair is provided in accordance with an appropriate room direction to each output channel signal and to its echo that is created by delaying the signal. The stereo signals thus created are then connected to a two-channel bus bar. However, this device has the following disadvantages:

a) The playback of a single HRTF is very costly if satisfactory precision is to be achieved, i.e., non-recursive digital filters of 50°–150° and recursive digital filters of 10°–30° are required. Thus, this process occupies a significant portion of the available computer capacity of a modern digital signal processor (DSP). Further, because several echoes have to be simulated, e.g., between 5–30, for a natural playback, the entire system (with a large number of channels) becomes nearly unaffordable due to the large number of filters necessary.

b) The binaural audio mixing console only supplies a stereo signal at the output that is suitable for headphone playback While an adaptation to loudspeaker, multi-channel technology may be made by modifying the filters and increasing the number of bus bars, the expenditure would significant.

D. S. McGrath and A. Reilly introduced another device in “A Suite of DSP Tools for Creation, Manipulation and Playback of Soundfields in the Huron Digital Audi Convolution Workstation” at the 100th AES Convention held in 1996 in Copenhagen and published in the preprint 4233. In this device, the number of bus bars is reduced by using an intermediate format, independent of the number or arrangement of loudspeakers, to display the sound field. The translation to the respective output format is provided through a decoder at the bus bar output. A “B-format” decoder is suggested for reproducing the sound field, in the two-dimensional case including three channels. The signal is weighted with the factors w, $x=\sin\phi$ and $y=\cos\phi$ and transferred onto the bus bar, in which w represents the signal level and $\phi$ the room direction. The B-format decoder controls the loudspeakers such that a sound field is optimally reconstructed at one point in the room in which the listener is located. However, this process has the disadvantage that the achievable localization focus is too low, i.e., neighboring and opposing loudspeakers radiate the same signal with only slight differences in the sound level. To achieve “discrete effects” an accurate high channel separation is required. In a film mix, e.g., a sound should come exactly from a certain direction. This problem can be traced back to the selected sound field format (e.g., an insufficient number of channels) or to the design of the decoder that was optimized to reproducing of the sound field, and not optimized to channel separation. A further drawback is that only a passive matrix circuit is designed in the decoder. Thus, implementation of direction-dependent “pan-filters” required at the outset would demand a significantly higher number of discretely transferred directions, as is mentioned in the following in more detail.

SUMMARY OF THE INVENTION

The present invention provides a process and device for producing the most natural sound playback over a number of loudspeakers when a different number of sound sources are present while also using a minimal amount of technical expenditure.

The present invention provides mixing 1–N sound signals to 1–M output signals by separating the sound signal from each input channel and selectively delaying the separated sound signal, selectively weighting each separated and selectively delayed sound or input signal, adding these signals to appropriate additional input signals from other input channels to one intermediate signal 1–K, and separating each separate intermediate signal into output channels 1–M, defiltering the separated intermediate signal and summing them together with the other intermediate signals. The summed-up intermediate signals together produce an output signal for a loudspeaker.

The device of the present invention for mixing sound signals from input channels E1–EN to output channels A1–AM shows each intermediate channel Z1–ZK coupled with an accumulator S and a multiplier M, each with 1–n partial channels of each input channel, and coupled with a decoder D that produces output channels A1–AM. In decoder D, each intermediate channel is separated into a number of filter channels with filters equivalent to the number of output channels and each filter channel is coupled to a filter channel of each of the other intermediate channels through an accumulator.

The achieved advantages of the present invention are especially apparent in view of the fact that the task-description defined at the outset is solved in all aspects. That is, the expenditure in particular is minimal, since the computing-intensive filters are needed only once in the system, i.e., at the output. The proposed sound field format is extremely useful for archiving music-material, since all available multi-channel formats can be created by choosing the appropriate decoders. Moving sources can also be simulated in a simple way, since no switching of filters is needed.

The present invention is directed to a process for mixing a plurality of sound signals. The process includes separating each sound signal and selectively delaying each separated sound signal. The process also includes selectively weighting each separated and selectively delayed sound signal and adding corresponding ones of the selectively weighted signals to an intermediary signal. The process also includes separating and filtering each intermediary signal, and adding the intermediary signals to form an output signal.

In accordance with another feature of the present invention, the process further includes modeling inter-aural transit time differences during the filtering. Further, the process includes modeling the intensity differences and transmit time differences independent of each other.

In accordance with another feature of the present invention, the process further includes modeling inter-aural intensity differences during the filtering. Further, the process includes modeling the intensity differences and transmit time differences independent of each other.

The present invention is directed to a device for mixing sound signals of a plurality of input channels into a plurality of output channels. The device includes each input channel having a plurality of partial channels, a decoder providing the plurality of outputs, and a plurality of intermediary channels coupled to the plurality of partial channels and to the decoder.

In accordance with another feature of the present invention, each intermediary channel includes a plurality of filter channels with filters. The plurality of filter channels corresponds with the number of output channels. The device also includes an accumulator and at least one filter channel of each of the intermediary channels being coupled through the accumulator.

In accordance with a further feature of the present invention, the device includes a multiplier such that the intermediary channels being coupled to partial channels through the accumulator and the multiplier.

In accordance with a still further feature of the present invention, the filters may include IIR-filters and FIR-filters that are switched in series.

The present invention is directed to a process for mixing a plurality of sound signals. The process includes separating each sound signal, selectively delaying each separated sound signal, selectively weighting each separated and selectively delayed sound signals in accordance with a number of channels, adding the selectively weighted signals corresponding to a same channel to form a plurality of intermediary signals, and decoding each intermediary signal to produce a plurality of output signals.

In accordance with another feature of the present invention, the decoding includes separating each intermediary signal into a plurality of signals to be filtered, the plurality of signals corresponding in number to a number of the plurality of output signals, filtering each separated intermediary signal, and adding corresponding filtered signals together to form the plurality of output signals.

In accordance with still another feature of the present invention, the filtering includes utilizing head related transfer functions normalized for each output direction.

In accordance with a further feature of the present invention, the filtering includes selecting a reference direction for normalization, determining a filter pair for each angle of incidence, approximating each filter pair by transfer functions of recursive filters of between approximately 1 and 6 degrees, processing the signal in a non-recursive filter, and processing the signal in a recursive filter.

In accordance with a still further feature of the present invention, the selective weighting includes multiplying the separated and selectively delayed sound signals for a particular channel by a weighting factor.

In accordance with another feature of the present invention, the separation of the sound signals includes separating each sound signal into a number of signals corresponding to a number of the plurality of sound signals to be mixed.

The present invention is directed to a device for mixing sound signals. The device includes a plurality of input channels, each input channel including a plurality of partial channels, a plurality of output channels, a decoder having a plurality of outputs corresponding to the plurality of outputs, and a plurality of intermediary channels coupled to the plurality of partial channels and to the decoder.

In accordance with another feature of the present invention, the plurality of partial channels corresponds in number to the plurality of input channels.

In accordance with another feature of the present invention, the device includes a plurality of multipliers corresponding in number to the plurality of intermediary channels, and each multiplier weighting the signal associated with each partial channel. Further, the device includes a plurality of accumulators coupled to add the weighted signals to each intermediary channel.

In accordance with yet another feature of the present invention, the decoder includes a plurality of filter channels for each intermediary channel corresponding decoder outputs, and an accumulator coupled to a filter channel associated each intermediary channel and to output a decoded signal. Further, each filter channel includes a finite duration impulse response filter and an infinite duration impulse response filter.

Other exemplary embodiments and advantages of the present invention may be ascertained by reviewing the present disclosure and the accompanying drawing.

BRIEF DESCRIPTION OF THE DRAWINGS

The present invention may be further described in the detailed description which follows, in reference to the noted drawing by way of non-limiting example of a preferred embodiment of the present invention, and wherein.

DETAILED DESCRIPTION OF THE PRESENT INVENTION

Figure 2:
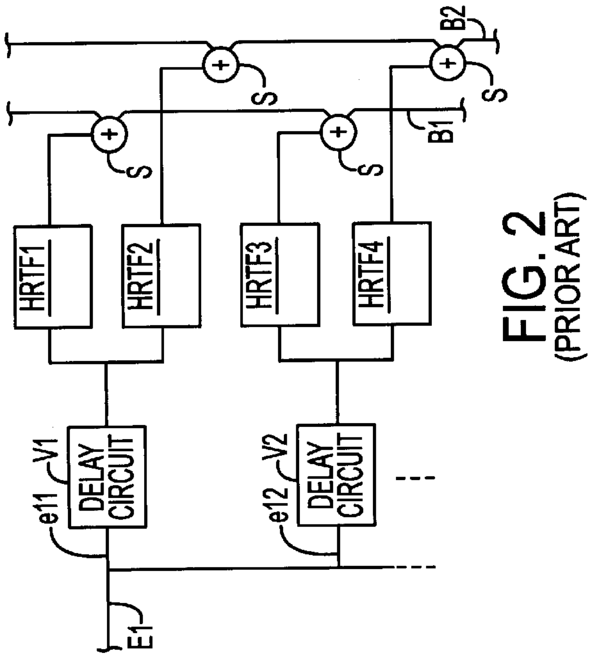
FIG. 2 (PRIOR ART)
FIGS. 1, 2, and 3 illustrate schemes of the assembly of a device in accordance with prior art.

The particulars shown herein are by way of example and for purposes of illustrative discussion of the preferred embodiments of the present invention only and are presented in the cause of providing what is believed to be the most useful and readily understood description of the principles and conceptual aspects of the invention. In this regard, no attempt is made to show structural details of the invention in more detail than is necessary for the fundamental understanding of the invention, the description taken with the drawing figure making apparent to those skilled in the art how the invention may be embodied in practice.

Figure 1:
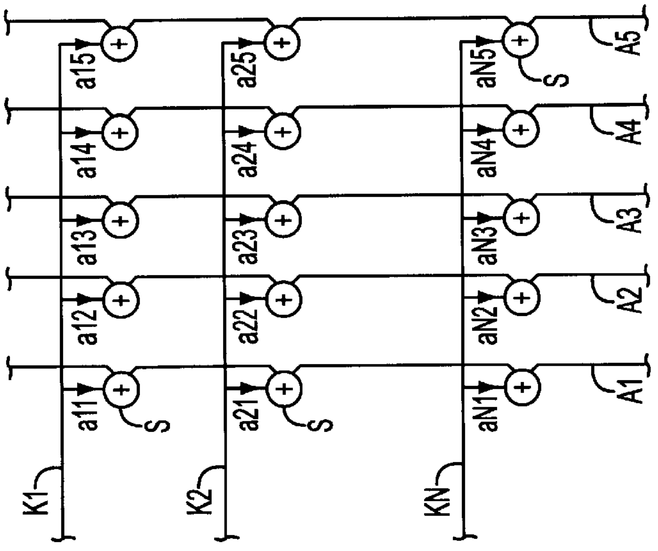
FIG. 1 (PRIOR ART)

FIG. 1 illustrates a known arrangement as was discussed above. This particular arrangement includes channels K1, K2, . . . , KN for input-signals, e.g., microphones, and channels A1, A2, A3, A4, A5, etc. for output-signals, e.g., a corresponding number of loudspeakers. The channels K1–KN are connected to the channels or bus bars Al, A2, A3, A4, A5, etc. with a multiplier, not shown here, for factors a11–aN5 and accumulator S. This arrangement provides a so-called summation-matrix circuitry, in which the input-signal is loaded directly through the multiplier and directed to bus bars Al, A2, A3, A4, A5. Thus one signal, composed of several input-signals, is available for each loudspeaker whereby the component of the input-signal is measured with a multiplication-factor a11–aN5 in the output-signal of the bus bar A1, A2, etc.

FIG. 2 illustrates another known, and earlier-mentioned arrangement, in which only one of the many possible input-channels E1 is shown. Input channel E1 is divided into channels e11, e12, etc. in which delay-circuitry V1, V2, etc. is implemented. Outputs of each delay-circuitry V1, V2 each enter into switching HRTF 1–4 for the processing by a head-transfer function. Outputs of the HRTF-circuitry are connected to two bus bars B1, B2 via accumulator S. This corresponds to the earlier mentioned binaural audio mixing console in accordance with the document of Richter and Persterer.

Figure 3:
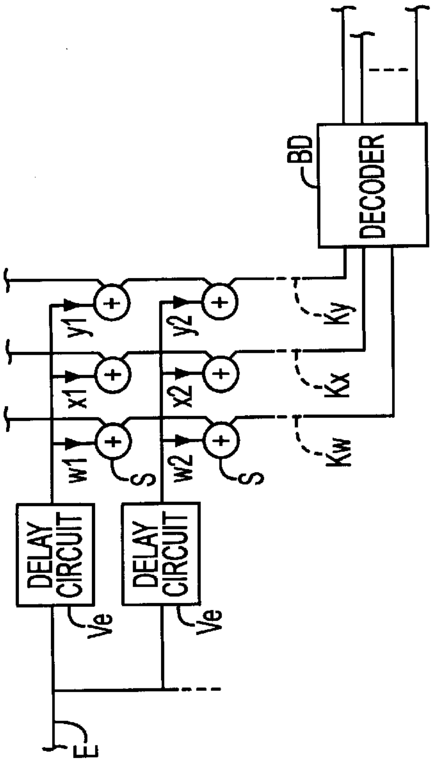
FIG. 3 (PRIOR ART)

FIG. 3 illustrates a third known arrangement in accordance with the above-noted document of D. McGrath, in which an input signal from a channel E is repeatedly divided and delayed in delaying-circuitry Ve, and is, as known, multiplied or attenuated by factors w1, x1, y1, and w2, x2, y2, etc. The signals then reach channels Kw, Kx, and Ky via an accumulator S and form the signals w, x, and y. A decoder BD transforms these signals w, x, and y into input signals for, e.g., five loudspeakers.

Figure 4:
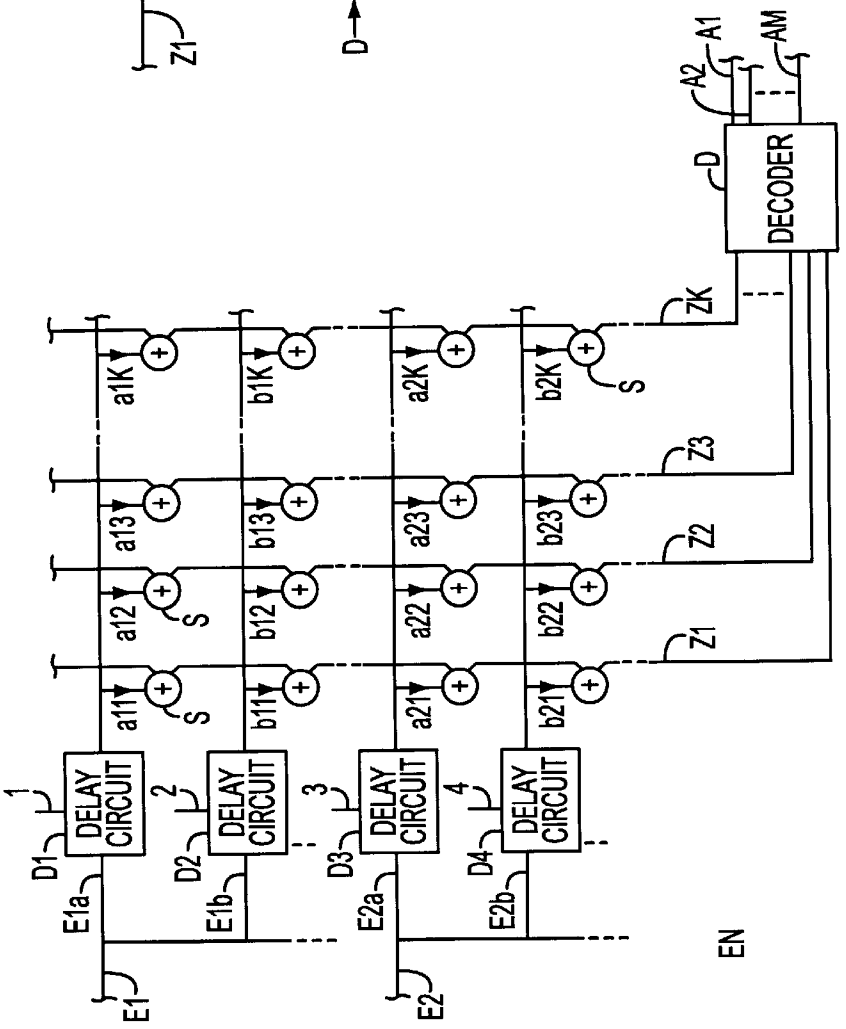
FIG. 4 illustrates a scheme of the assembly of a device in accordance with the present invention.

FIG. 4 illustrates a schematic of an exemplary arrangement in accordance with the present invention showing two input-channels, e.g., E1 and E2. However, it is noted that the number of input channel may be expanded to N channels, where N is any number. Each input-channel E1, E2, etc. may be divided into several channels, e.g., E1*a*, E1*b*, E2*a*, E2*b*, etc. However, it is here noted that division into n channels is possible. In each channel, delay-circuitry D1, D2, D3, D4, etc. may be positioned and delay circuitry D1, D2, D3, D4 may be modulated with modulators 1, 2, 3, 4, respectively. Intermediate channels Z1–ZK may be coupled to each channel E1*a*, E1*b*, E2*a*, E2*b* to Enn via an accumulator S. A multiplier may be arranged to precede accumulator S (see FIG. 6). In this manner, all intermediate channels Z1–ZK enter into a decoder D having outputs forming output-channels A1, A2, . . . , AM.

Figure 5:
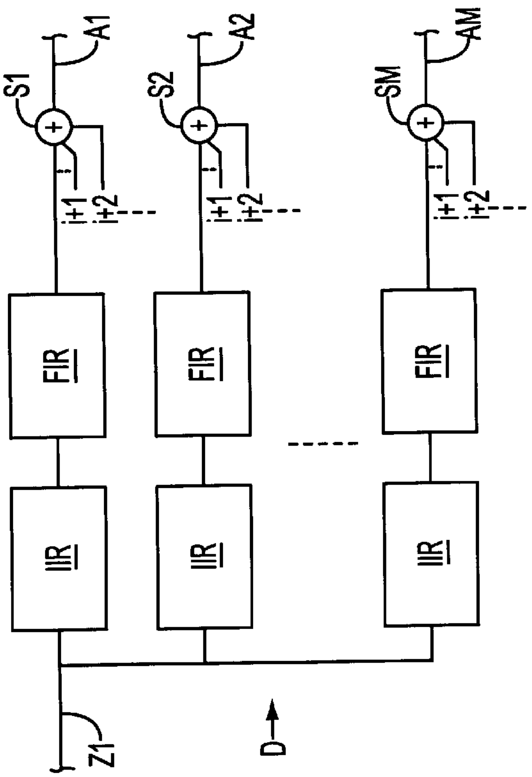
FIGS. 5 and 6 illustrate a portion of the assembly in accordance with FIG. 4.

FIG. 5 illustrates a diagram for the assembly of decoder D, as utilized in FIG. 4. Decoder D may have a number of inputs corresponding to the number of intermediate channels Z1–ZK. In the exemplary illustration, only one input, i.e., intermediate channel Z1, is shown. Each intermediate channel is divided into a number of filter channels corresponding to the number of decoder outputs. Accordingly, for the ease of description and understanding, the filter channels have been referenced with the same references, i.e., A1–AM, as the output-channels in FIG. 4. The signal in each filter-channel or output-channel A1–AM is processed by an IIR-filter (infinite-duration impulse response) and by a FIR-filter (finite-duration impulse response) which are switched in series. In each filter-channel or output channel A1–AM, an accumulator S1–SM, similar in general to those preceding decoder D. Summing integrators S1–SM have a number of inputs corresponding to the number of intermediary channels Z1–ZK.

Figure 6:
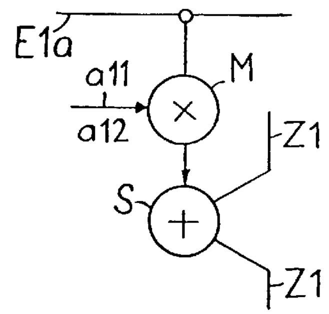

FIG. 6 illustrates accumulator S, which here, for purposes of this example, is coupled to intermediary channel Z1 and to a pre-connected multiplier M. Pre-connected multiplier M includes an input location for factors a11, a12, etc., as is shown in FIG. 4, and a connection to an input-channel, e.g., E1*a*.

Figure 7:
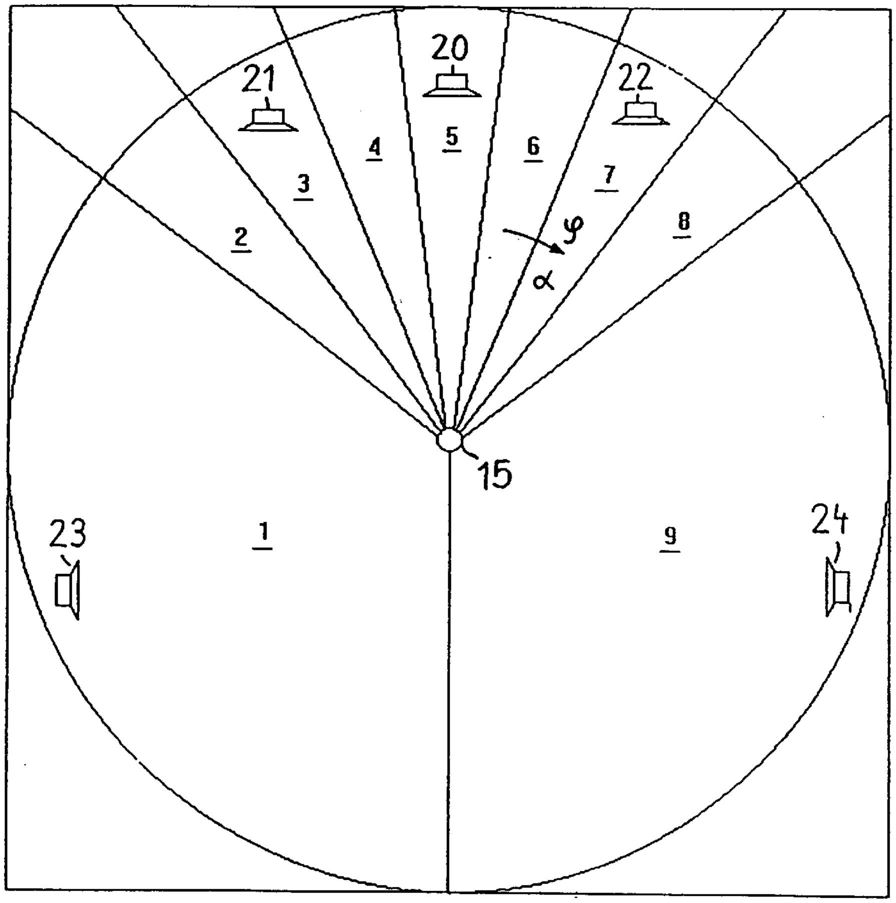
FIGS. 7 and 8 illustrate a sound field format or an arrangement of loudspeakers.

FIG. 7 illustrates the most important standardized surround-format of today. The surround-format includes a "center loudspeaker" 20 (installation-angle approximately 0°), which is positioned directly in front of a listener 15 (illustrated as a circle); two stereo-loudspeakers 21 and 22, which are positioned equidistant from listener 15 at a frontal angle of approximately +/31 30°; and two rear surround-loudspeakers 23 and 24 positioned at an angle of between approximately +/–110–130°. During music-playback, front loudspeakers 20, 21, and 22 serve as transmitters of the sound-occurrences, so that a stage results. The rear systems 23 and 24 are primarily utilized to emit diffused room echoes.

Figure 8:
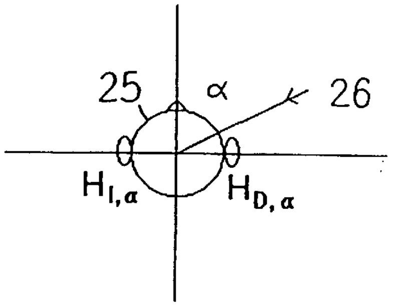

Accordingly, in front of listener 15, a substantially more precise playback is required. This fact can be accounted for by the selection of the space-orientation, in that the resolution is selected differently in accordance with the selected space-orientation. For example, very good results are already obtained with K=9 channels, with the following interval-limits:

Channel 1: left rear
Channel 2: −37.5° to −52.5°
Channel 3: −22.5° to −37.5°
Channel 4: −7.5° to −22.5°
Channel 5: −7.5° to 7.5°
Channel 6: 7.5° to 22.5°
Channel 7: 22.5° to 37.5°
Channel 8: 37.5° to 52.5°
Channel 9: right rear FIG. 8 illustrates the head of a listener 25, e.g., depicted as a circle, and a beam from a sound source with an angle of sound incidence a.

Figure 9:
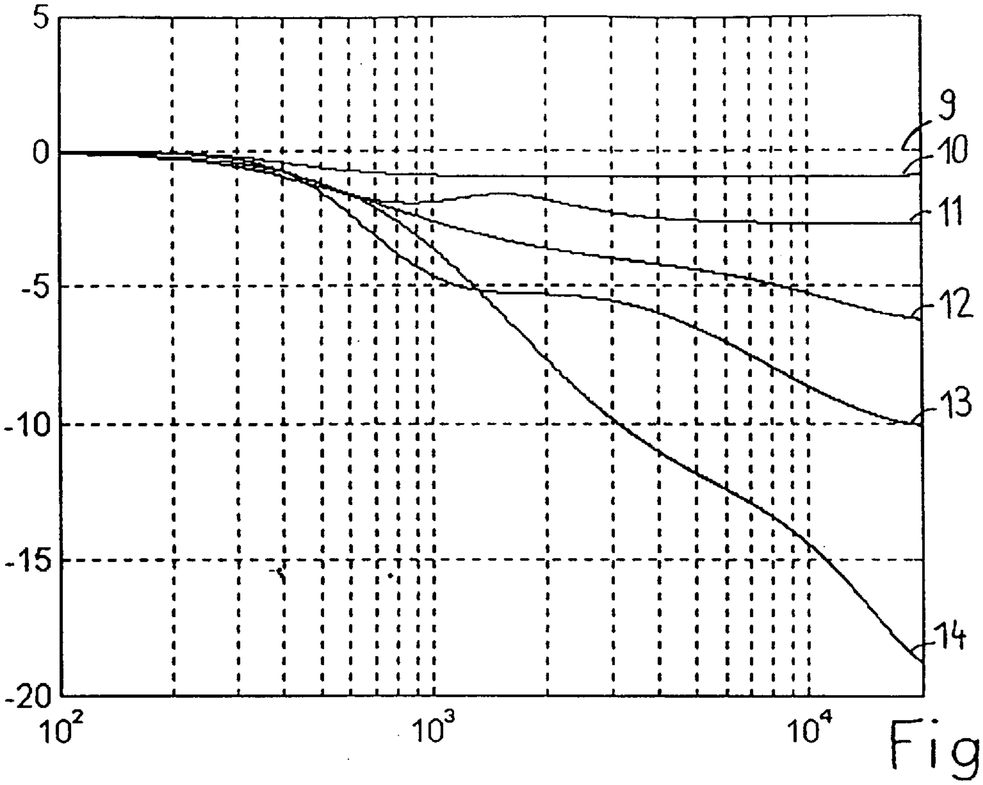
FIGS. 9, 10, and 11 illustrate frequency responses achieved with present invention.

FIG. 9 illustrates resulting amplitude frequency responses of a filter pair that is normalized by 30° with respect to the head for various incoming angles of sound incidence. Depending on the angle of sound incidence, which strikes onto a listener (head), varying frequency responses 10 to 14 result for the amplitudes of a signal emitted from a loudspeaker. The loudspeaker, which is located in the same half-plane as the incoming sound-signal, emits "direct-components" of the opposing "indirect-components." Because of the normalization of the signal, the linear frequency response 9 results from a signal, which is emitted directly at an angle of 30°. Plot 10 shows a frequency response for sound emitted at a direct angle of sound incidence measuring 15°, plot 11 shows a frequency response for sound emitted at an angle of 0°, plot 12 shows a frequency response for sound emitted at an indirect angle of 15°, plot 13 shows a frequency response for sound emitted at an indirect angle of 30°, and plot 14 shows a frequency response for sound emitted at an indirect angle of 60°.

Figure 10:
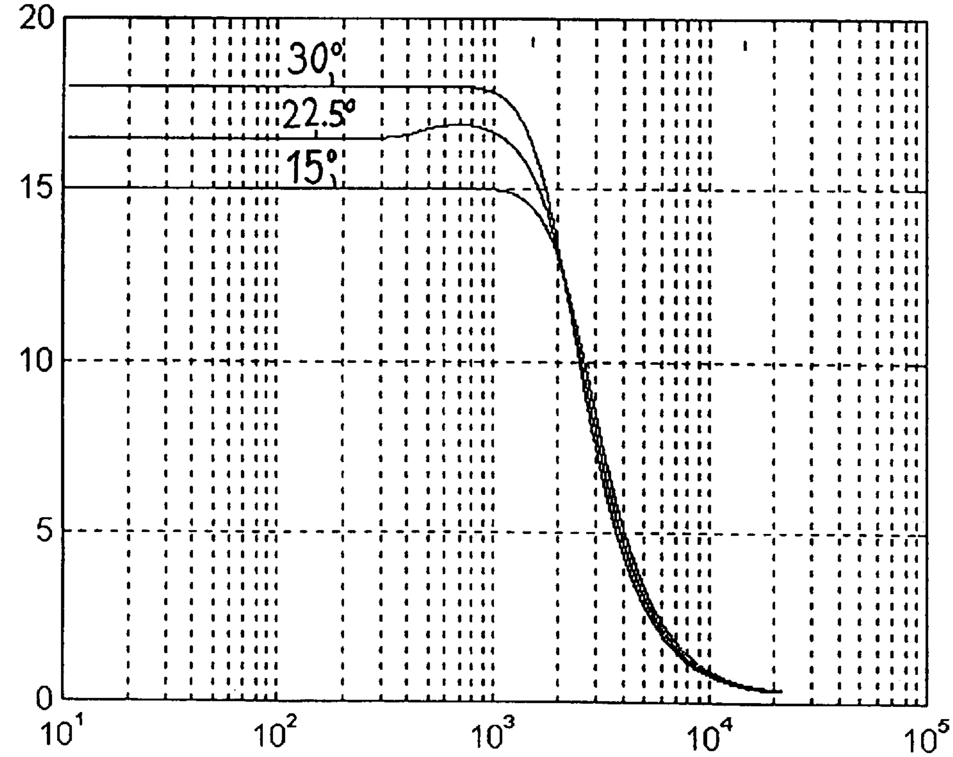

FIG. 10 illustrates a frequency response for the transmission time of a sound signal from three set room directions having an angles of incidence of 15°, 22.5°, and 30°. The values for the frequencies between 10–100,000 Hz are plotted along the abscissa and the values for time delays are plotted along the ordinate.

Figure 11:
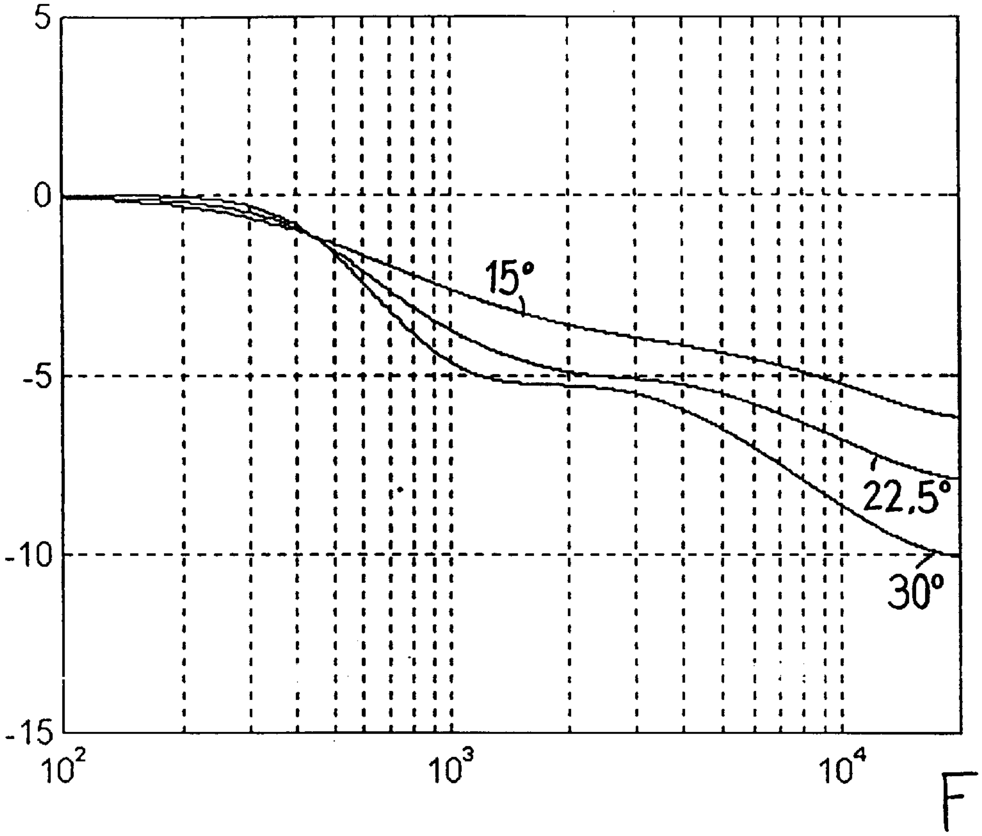

FIG. 11 illustrates the resulting amplitude frequency responses of the indirect components for a signal from three spatial directions. Frequencies are plotted along the abscissa values and the attenuation of the amplitudes is plotted along the ordinate in dB. The three spatial directions utilized in this plot are from space-directions measuring 15°, 22.5°, and 30°.

With reference to the above-described exemplary illustrations of the present invention, the sound mixing process operates in the following manner. Assuming two input signals, as depicted in FIG. 4, and M=5 output signals are to be transformed by the present invention for five loudspeakers, then both input signals, i.e., E1 and E2, are each divided into input signals E1*a*, E1*b*, and E2*a*, E2*b*. Input signals E1*a* and E2*a* are intended for direct, non-reflecting emission to the listener, and, therefore, are not to be delayed. Accordingly, input signals E1*a* and E2*a* get a delay rate of zero. Input signals E1*b* and E2*b* are intended to reflect so as to create or simulate a longer transit time of the signals. Accordingly, input signals E1*b* and E2*b* are fitted with a special delay in delay-circuitry D2 and D4. In accordance with the surround-format shown in FIG. 7, nine intermediary channels Z1–Z9 may be provided. The operator of the sound mixing device of the present invention, i.e., the audio mixing console, determines the above-noted delays and the factors a11–b2K.

In determining the delays and factors, the operator may be guided by the following discussion. Nine intermediary signals Z1–ZK await at the decoder D (see example FIG. 7), and each intermediary signal is divided into M=5 signals, i.e., A1–AM, after being filtered in the IIR filter and in the FIR-filter. Separated signals A1–AM, e.g., from intermediary channel Z1, are summed up with the corresponding separated signals A1–AM from the other intermediary channels, i.e., Z2–ZK. In this manner, 5×9=45 signals are processed and combined into five output signals A1–AM.

Thus, echoes are created via N input channels with delay-members and the direct signal components (generally, delay 1=0) are weighted with factors a11, b11, etc., and switched onto K bus bars, which are immediately assigned to certain room directions that can be chosen freely. Echoes with factors b11–b1K are switched onto the bus bar in the same manner. Decoder D converts the resulting summation signal Z1–ZK into an appropriate desired loudspeaker format.

In accordance with the present invention, the frontal resolution hereby is 15° and the weight factors a11–b2K are set as follows: According to an assignment to a particular space direction, a maximum of two of the K factors are non-zero. If the signal is to come from an angle $\phi$ (FIG. 7), which does not lie exactly in the middle of the defined angle intervals, a weighting is performed, according to the function: 0.5 (1−cos $\pi$x) and 0.5 (1+cos $\pi$x), X $\epsilon$ (0,1). The weighting corresponds to conventional amplitude-panning functions, with the difference being that the sum of the functions, not the sum of the squares, is one. As an example, assuming $\phi$=22.5°, i.e., exactly the limit of the intervals of channels 6 and 7, such that x=0.5), the following values would result:

$$a_1=0,\ a_2=0,\ a_3=0,\ a_4=0,\ a_5=0,\ a_6=0.5\ w,\ a_7=0.5\ w,\ a_8=0,\ a_9=0,$$

where w corresponds to a desired level.

It should be particularly noted that decoder D (FIG. 5) is only required once in the system, i.e., at the summing output. All i summing signals (i=1–K) are switched over M filter paths, such that each output signal control the loudspeakers $L_1$–$L_m$. Appropriately filtered individual signals are thereby added thereto. The filters are thereby designed as head related filters, whereby the contour of the head profile to a reference direction (for example 0° or 30°) is simulated. This considers the rule described earlier so that the loudspeakers emit signals that are correlated with nature. Constructed therefore are head related transfer functions that have been normalized to that direction. In this manner, one ends up with the typical frequency responses illustrated in FIG. 9, in which the side facing the head ("direct") and the side facing away from the head ("indiret") are shown. The attenuation of higher frequencies increases with an increase in head profile. The filters are based on a simple head model (sphere). The advantage of this selection includes that the perceived timbre is independent of the individual listener and that the exact listening position for the most part remains neutral.

An important component of the invention is that the filters, as illustrated in FIG. 5, are divided up. For example, a recursive filter (IIR—allpass) models the inter-aural transit time differences up to a certain upper threshold frequency (see FIG. 10), and a linear phase FIR-filter models the amplitude differences independent thereof, as illustrated in FIG. 9. In this arrangement one can avoid undesirable comb filter effects that are created if two differently delayed signals are added. Above a certain frequency threshold, one would experience obliterations (cancellations) at places where the phase difference reaches 180°. Hence a constant, but frequency-dependent transit time which approaches zero at high frequencies is realized. If one assigns a signal to a room angle that is located exactly on the boundary of two intervals, as shown above, the frequency responses illustrated in FIG. 10 or FIG. 11 are obtained. It is noted that a very good interpolation is achieved although the number of present channels is relatively low. That means that a sound source can practically be moved continuously in the room although the number of preset head related transfer functions is relatively low.

The design of the filter in the decoder preferably should be performed in the following manner. The design is to be explained in accordance with the above example in which 9 sound field signals and 5 loudspeakers (see FIG. 7) are utilized. With the exception of channels 1 and 9, that are directly connected to the rear speakers without going through a filter, the filters shown in FIG. 5 are derived from head related transfer functions, which are defined in accordance with FIG. 8. The filter function $H_{(D,\alpha)}$ refers to the transfer function occurring at the sound source facing the ear, and $H_{(I,\alpha)}$ to the opposite side of the head. The functions are dependent on the angle of incidence α that is measured starting from the right ear in a counter-clockwise manner. Such measurements are, e.g., gathered from test people, artificial heads or by calculations on simple head models, as described by D. H. Cooper in "Calculator Program for Head-related Transfer Function" in the Audio Engineering Society (AES) Journal, No. 37, 1989, pp. 3–17 or by B. Gardner, K. Martin in "Measurements of a KEMAR dummy head" on the Internet at http://sound.media.mit.edu/KEMAR/html. The latter is particularly recommended for the use of loudspeaker playback in the present invention since a replay quality is achieved that is independent from the respective listener.

In the design of the filters the following methodology may be used.

1) Selection of a reference direction α0 for normalization. For each angle of incidence α one receives the filter pair $H_1=H_{(D,\alpha)}/H_{(D,\alpha0)}$ and $H_2=H_{(I,\alpha)}/H_{(D,\alpha0)}$. In this regard, it is noted that selection of α0=30° (Normalization to the angle of the stereo loudspeakers in the front) or α0=0° (Normalization to the frontal sound incidence) is useful.

2) Approximation of the amounts of $H_1$ and $H_2$ by transfer functions of recursive filters of lower degrees, for example, degrees 1–6. For this one cascades a sufficient number of filters of the first and second degree for which one preselects suitable types, e.g., peak-notch, shelving, etc. With the aid of pertinent available non-linear optimization programs, one can vary the parameters (e.g., the quality, threshold frequency, amplification) until an optimum is approached at a finite set of points on a logarithmic frequency scale. Values for the quality are therefore to be limited upwards to values of up to approximately 4. The purpose of this measure is the gaining of smoothed high quality filters that are free of resonances. This results in a more neutral, less distorted playback. The correlation of the loudspeaker signals emitted to the left and right that are important for listening and are thereby left intact. The methodology is to executed for all room angles in the center of the interval of the sound field channels, i.e. in the present example (FIG. 7)α=+/−(0°, 15°, 30°, 45°).

3) The linearly phased FIR filters (non-recursive) are obtained by evaluating the impulse answers in the (2) received recursive filters of a time window (e.g., square window of length 100) and is continued in a symmetrical manner.

4) The IIR-allpasses approximate the sound transit time of the direct component, $t_D$ to the right or indirect component $t_1$ to the left ear with a sound angle of incidence α. Depending on the head diameter h one obtains $t_1-t_D=h\sin(90°-\alpha)$ by using simple geometric calculations. The IIR-filters are cascaded allpasses of the second degree that are constructed from the denominator polynomial of a Bessel-low pass. The threshold frequency and the filtering degree are optimized such that favorable courses result in the interpolation functions that are illustrated in FIG. 11 and correspond to the frequency response of an audio mixing console input signal (FIG. 4) to the loudspeaker output if one chooses a room angle at the boundary of two intervals of sound channels.

5) The front stereo loudspeakers in accordance with FIG. 5 are controlled by one filter pair each that was derived according to 1) to 4). The "center loudspeaker" that is placed in the center is controlled, depending on the selected normalization, without filtering (in the case of a 0° normalization) or via a set filter $H_{(D,0)}/H_{(D,30)}$.

It is noted that the foregoing examples have been provided merely for the purpose of explanation and are in no way to be construed as limiting of the present invention. While the invention has been described with reference to a preferred embodiment, it is understood that the words which have been used herein are words of description and illustration, rather than words of limitation. Changes may be made, within the purview of the appended claims, as presently stated and as amended, without departing from the scope and spirit of the invention in its aspects. Although the invention has been described herein with reference to particular means, materials and embodiments, the invention is not intended to be limited to the particulars disclosed herein; rather, the invention extends to all functionally equivalent structures, methods and uses, such as are within the scope of the appended claims.

What is claimed:

1. A process for mixing a plurality of sound signals comprising:

separating each sound signal;

selectively delaying each separated sound signal:

selectively weighting each separated and selectively delayed sound signals in accordance with a number of channels;

adding the selectively weighted signals corresponding to a same channel to form a plurality of intermediary signals; and decoding each intermediary signal to produce a plurality of output signals, by:

separating each intermediary signal into a plurality of signals to be filtered, the plurality of signals corresponding in number to a number of the plurality of output signals;

filtering each separated intermediary signal; and adding corresponding filtered signals together to form the plurality of output signals, said filtering comprising:

selecting a reference direction for normalization;

determining a filter pair for each angle of incidence;

approximating each filter pair by transfer functions of recursive filters of between approximately 1 and 6 degrees;

processing the signal in a non-recursive filter; and processing the signal in a recursive filter.

2. The process in accordance with claim 1, further comprising modeling inter-aural transit time differences during the filtering.

3. The process in accordance with claim 2, further comprising modeling the intensity differences and transmit time differences independent of each other.

4. The process in accordance with claim 1, further comprising modeling inter-aural intensity differences during the filtering.

5. The process in accordance with claim 4, further comprising modeling the intensity differences and transmit time differences independent of each other.

6. The process in accordance with claim 1, wherein the selective weighting comprises multiplying the separated and selectively delayed sound signals for a particular channel by a weighting factor.

7. The process in accordance with claim 1, wherein the separation of the sound signals comprises separating each sound signal into a number of signals corresponding to a number of the plurality of sound signals to be mixed.

* * * * *